(12) United States Patent
Ke et al.

(10) Patent No.: US 11,035,378 B2
(45) Date of Patent: Jun. 15, 2021

(54) FAN STRUCTURE AND ELECTRONIC ASSEMBLY

(71) Applicant: Acer Incorporated, New Taipei (TW)

(72) Inventors: Jau-Han Ke, New Taipei (TW);
Shun-Ta Yu, New Taipei (TW);
Cheng-Yu Cheng, New Taipei (TW);
Cheng-Wen Hsieh, New Taipei (TW);
Wen-Neng Liao, New Taipei (TW)

(73) Assignee: Acer Incorporated, New Taipei (TW)

( * ) Notice: Subject to any disclaimer, the term of this patent is extended or adjusted under 35 U.S.C. 154(b) by 50 days.

(21) Appl. No.: 16/292,350

(22) Filed: Mar. 5, 2019

(65) Prior Publication Data

US 2019/0277306 A1 Sep. 12, 2019

(30) Foreign Application Priority Data

Mar. 8, 2018 (TW) .................................. 107107957

(51) Int. Cl.
| | |
|---|---|
| *F04D 29/44* | (2006.01) |
| *F04D 17/16* | (2006.01) |
| *F04D 29/42* | (2006.01) |
| *H05K 7/20* | (2006.01) |
| *G06F 1/20* | (2006.01) |

(52) U.S. Cl.
CPC .......... *F04D 29/441* (2013.01); *F04D 17/16* (2013.01); *F04D 29/4213* (2013.01); *F04D 29/4226* (2013.01); *H05K 7/20136* (2013.01); *H05K 7/20172* (2013.01); *G06F 1/203* (2013.01)

(58) Field of Classification Search
CPC .... F04D 29/08; F04D 29/403; F04D 29/4206; F04D 29/4213; F04D 29/44; F04D 29/441; F04D 29/4226; F04D 29/661; F04D 29/667; H05K 7/20136; H05K 7/20172; G06F 1/203
See application file for complete search history.

(56) References Cited

U.S. PATENT DOCUMENTS

| | | | |
|---|---|---|---|
| 5,551,836 A * | 9/1996 | Roth | F04D 29/4213 415/204 |
| 6,585,485 B2 * | 7/2003 | Lee | F04D 29/4213 415/176 |

(Continued)

FOREIGN PATENT DOCUMENTS

| | | |
|---|---|---|
| CN | 101173665 | 5/2008 |
| CN | 102927019 | 2/2013 |

(Continued)

*Primary Examiner* — Brian P Wolcott
(74) *Attorney, Agent, or Firm* — JCPRINET

(57) ABSTRACT

A fan structure including a fan housing and a fan body is provided. The fan housing includes a base and a cover assembled on the base. The cover includes a main portion, a periphery portion, a plurality of connecting portions and a plurality of flow guiding portions. The connecting portions are connected to the main portion and the periphery portion. The cover has a plurality of air inlet openings among the main portion, the periphery portion and connecting portions, wherein each of the flow guiding portions protrudes from the main portion and is adjacent to an inner side of the corresponding air inlet opening. The fan body is rotatably disposed in the fan housing. An electronic assembly is also provided.

10 Claims, 3 Drawing Sheets

(56) References Cited

U.S. PATENT DOCUMENTS

| | | | | |
|---|---|---|---|---|
| 6,789,998 B2* | 9/2004 | Chen | ............................ | F01D 5/26 |
| | | | | 415/1 |
| 7,431,558 B2* | 10/2008 | Krempel | .............. | F04D 29/4213 |
| | | | | 415/102 |
| 7,909,571 B2* | 3/2011 | Wu | ...................... | F04D 29/4213 |
| | | | | 415/206 |
| 9,568,019 B2* | 2/2017 | Lu | ........................... | F04D 29/522 |
| 9,739,287 B2* | 8/2017 | Cocks | ...................... | F04D 17/16 |
| 9,765,788 B2* | 9/2017 | Dybenko | ............. | F04D 25/0613 |
| 10,006,471 B2* | 6/2018 | Wang | ..................... | F04D 29/281 |
| 2013/0199759 A1* | 8/2013 | Chou | ....................... | F28F 13/12 |
| | | | | 165/121 |
| 2015/0300368 A1* | 10/2015 | Hsu | ....................... | F04D 29/703 |
| | | | | 415/108 |

FOREIGN PATENT DOCUMENTS

| | | |
|---|---|---|
| CN | 107734939 | 2/2018 |
| CN | 107816455 | 3/2018 |
| KR | 20080089975 | 10/2008 |
| TW | M310371 | 4/2007 |
| TW | M468707 | 12/2013 |
| TW | M517840 | 2/2016 |
| TW | M535272 | 1/2017 |

* cited by examiner

FAN STRUCTURE AND ELECTRONIC ASSEMBLY

CROSS-REFERENCE TO RELATED APPLICATION

This application claims the priority benefit of Taiwan application serial no. 107107957, filed on Mar. 8, 2018. The entirety of the above-mentioned patent application is hereby incorporated by reference herein and made a part of this specification.

BACKGROUND OF THE INVENTION

Field of the Invention

The invention relates to a fan structure and an electronic assembly, and particularly relates to a fan structure and an electronic assembly using the fan structure.

Description of Related Art

Common electronic devices, for example, laptops, tablets, or smartphones, etc., have features, such as easy to carry, instant messaging, and information processing, and have thus become necessary tools for modern people. Take a laptop as an example. To meet the user's need, lightweight design has become the mainstream of development. Therefore, the space within the body of the laptop for disposing electronic elements has been gradually reduced. For example, a fan and a heat dissipation structure corresponding to the fan are usually disposed in the body of the laptop for active cooling. In response to the development trend of lightweight, the size of the fan has been constantly reduced, and thus air inlet efficiency and structural strength of the fan are affected.

SUMMARY OF THE INVENTION

The invention provides a fan structure, enabling to enhance air inlet efficiency.

The invention provides an electronic assembly having great heat dissipation efficiency.

The fan structure of the invention includes a fan housing and a fan body. The fan housing includes a base and a cover assembled on the base, wherein the cover includes a main portion, a periphery portion, a plurality of connecting portions and a plurality of flow guiding portions. The connecting portions are connected to the main portion and the periphery portion. The cover has a plurality of air inlet openings among the main portion, the periphery portion and the connecting portions, wherein each of the flow guiding portions protrudes from the main portion and is adjacent to an inner side of the corresponding air inlet opening. The fan body is rotatably disposed in the fan housing.

The electronic assembly of the invention includes a casing and the fan structure. The fan structure includes the fan housing and the fan body. The fan housing includes the base and the cover assembled on the base, wherein the cover includes the main portion, the periphery portion, a plurality of the connecting portions and a plurality of the flow guiding portions, and the connecting portions are connected to the main portion and the periphery portion. The cover has plurality of the air inlet openings among the main portion, the periphery portion and the connecting portions, wherein each of the flow guiding portions protrudes from the main portion and is adjacent to an inner side of the corresponding air inlet opening. Each of the flow guiding portions keeps a distance with the inner surface of the casing. The fan body is rotatably disposed in the fan housing.

In view of the foregoing, the fan housing of the fan structure of the invention is configured with the flow guiding portion. The flow guiding portion is adjacent to the air inlet opening and configured to guide the air flows generated during operation of the fan body to enter into the fan housing from the air inlet openings, so as to enhance air inlet efficiency. Therefore, the electronic assembly adopted the fan structure of the invention has great heat dissipation efficiency.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
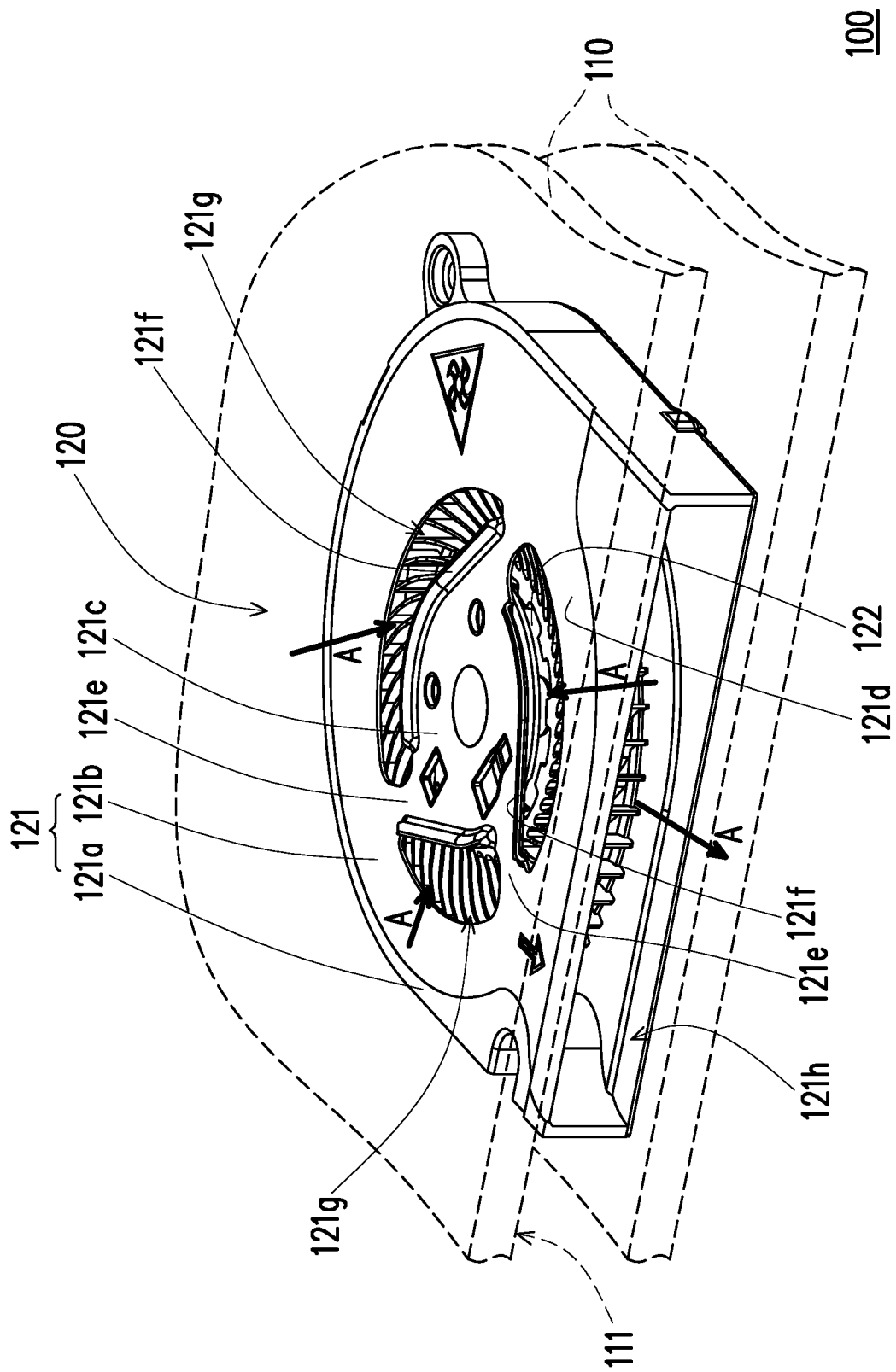
FIG. 1 is a three-dimensional schematic view of an electronic assembly of an embodiment of the invention.
Figure 2:
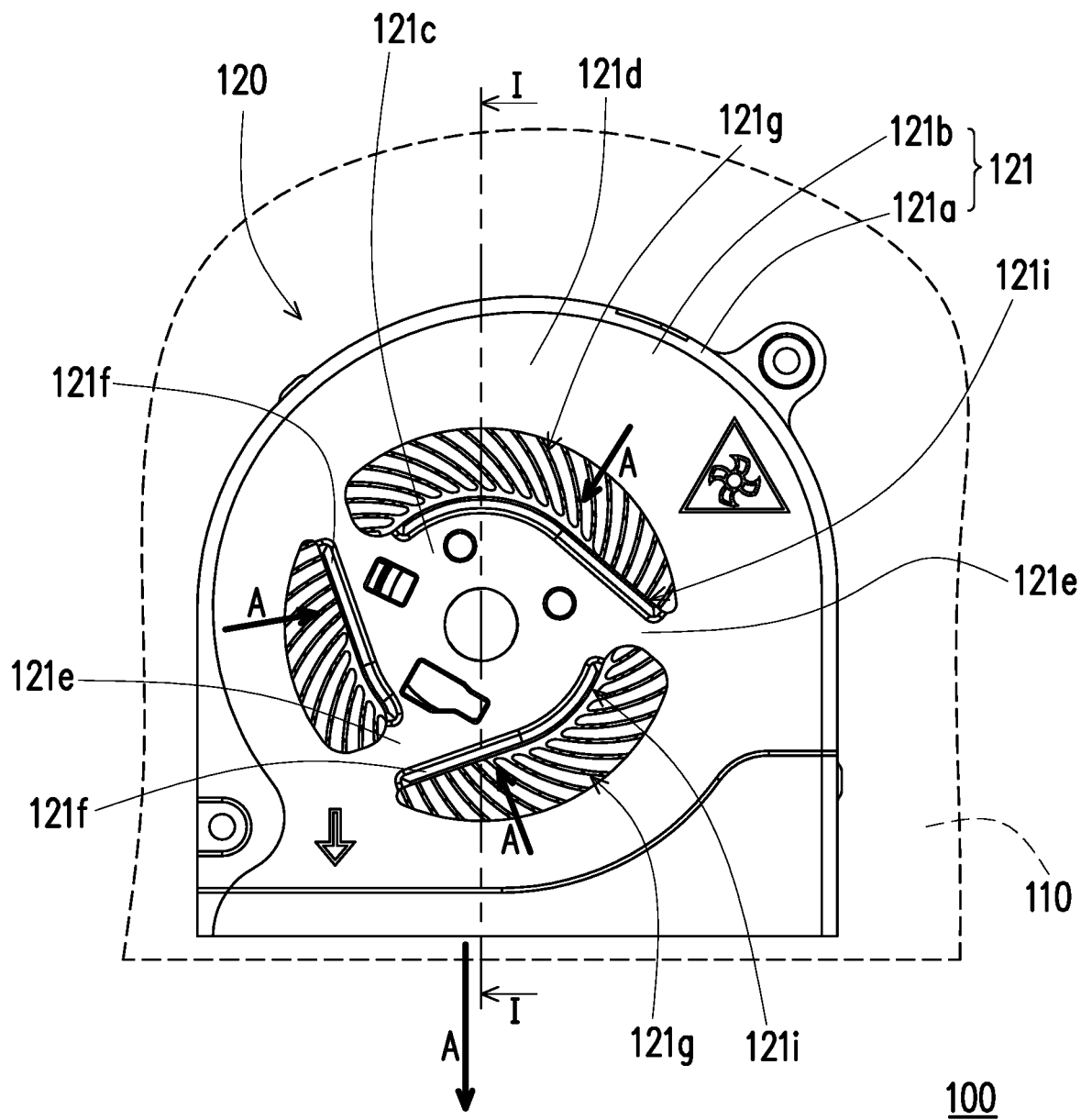
FIG. 2 is a schematic top view of an electronic assembly of FIG. 1.
Figure 3:
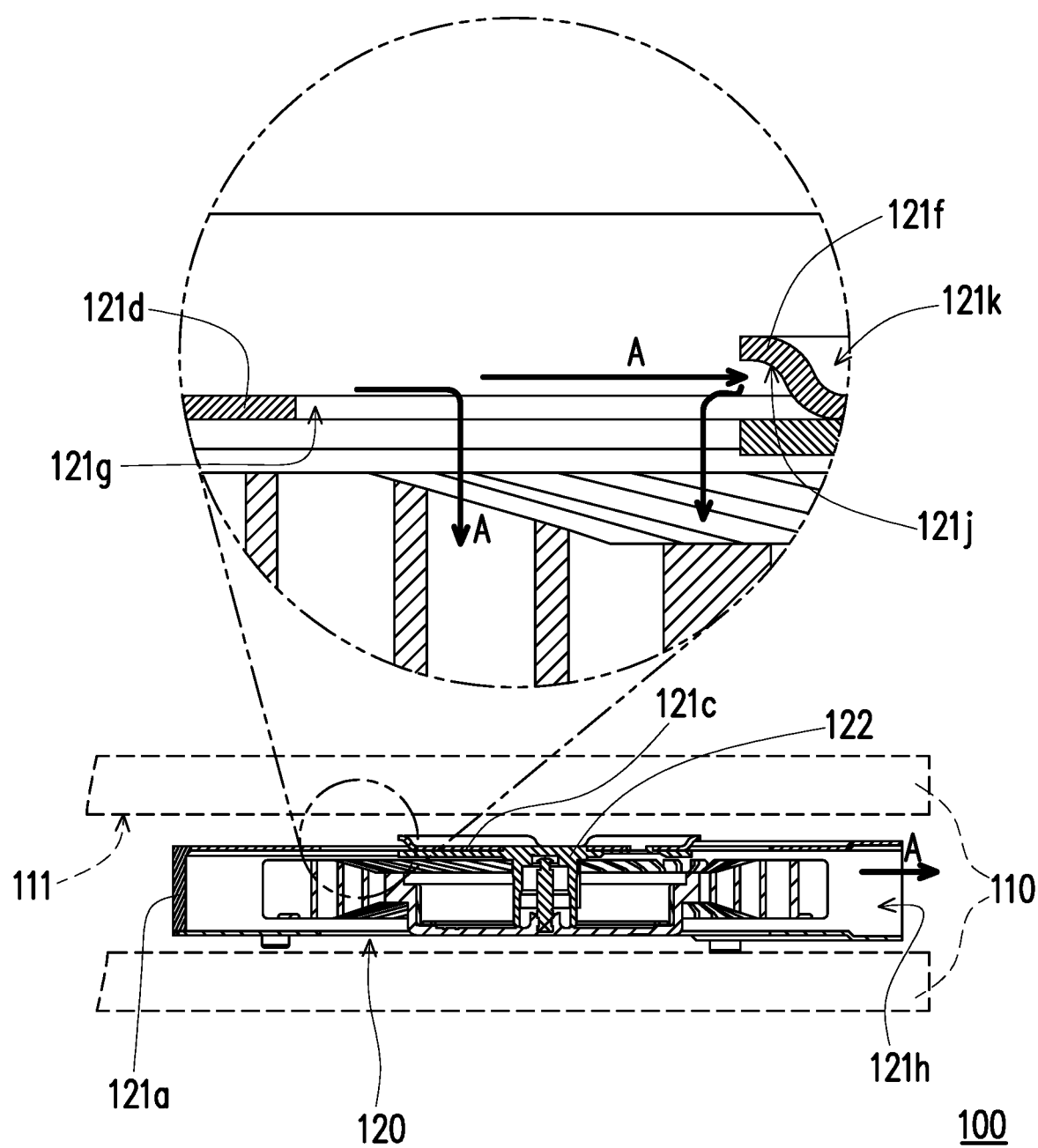
FIG. 3 is a cross-sectional schematic view of an electronic assembly taken along line I-I of FIG. 2.

FIG. 1 is a three-dimensional schematic view of an electronic assembly of an embodiment of the invention. FIG. 2 is a schematic top view of an electronic assembly of FIG. 1. FIG. 3 is a cross-sectional schematic view of an electronic assembly taken along line I-I of FIG. 2. For a definite illustration and easier explanation, the casing 110 of FIG. 1 to FIG. 3 are schematically illustrated in broken lines. Please refer to FIG. 1 to FIG. 3, in this embodiment, an electronic assembly 100 is, for example, a body of a laptop, including a casing 110 and a fan structure 120, and the fan structure 120 is disposed in the casing 110. An electronic element (not illustrated) is disposed in the casing 110. The heat generated during operation of the electronic element (not illustrated) is discharged to the outside through the fan structure 120.

The fan structure 120 includes a fan housing 121 and a fan body 122, and the fan body 122 is rotatably disposed in the fan housing 121. The fan housing 121 includes a base 121a and a cover 121b assembled on the base 121a, and the fan body 122 is mounted on the cover 121b. Furthermore, the cover 121b includes a main portion 121c, a periphery portion 121d, a plurality of connecting portions 121e and a plurality of flow guiding portions 121f, wherein the fan body 122 is mounted on the main portion 121c, and the connecting portions 121e are connected to the main portion 121c and the periphery portion 121d to strengthen the structural strength of the fan housing 121. The cover 121b has a plurality of air inlet openings 121g among the main portion 121c, the periphery portion 121d and connecting portions 121e, and one side of the base 121a and the cover 121b has an air outlet opening 121h. Air flows generated during operation of the fan body 122 enter from the air inlet openings 121g into the fan housing 121, and are discharged from the air outlet opening 121h.

In this embodiment, the air inlet openings 121g surround the main portion 121c, wherein each of the air inlet openings 121g is located between any two of the connecting portions 121e, and the periphery portion 121d surrounds the air inlet openings 121g. Each of the flow guiding portions 121f protrudes from the main portion 121c, wherein each of the flow guiding portions 121f extends toward the inner surface 111 of the casing 110, but keeps a distance with the inner surface 111. Therefore, when the casing 110 is deformed by force, the deformed casing 110 may contact the flow guiding portions 121f. Thus, the flow guiding portions 121f have a supportive effect, so as to avoid an excessive deformation of the fan housing 121 and thus affect the operation of the fan body 122. In addition, even if the deformed casing 110 contacts the flow guiding portions 121f, a route providing the air flows A passing through between the fan housing 121 and the casing 110 is maintained owing to the support of the flow guiding portions 121f.

Please further refer to FIG. 1 to FIG. 3, in this embodiment, one side of each of the air inlet openings 121g close to the main portion 121c is configured with one of the flow guiding portions 121f, and each of the flow guiding portions 121f is adjacent to an inner side 121i of the corresponding air inlet opening 121g. Furthermore, each of the flow guiding portions 121f extends along the inner side 121i of the corresponding air inlet opening 121g, and is located between any two of the connecting portions 121e. That is, each of the flow guiding portions 121f extends from one of the connecting portions 121e to another of the connecting portions 121e along the inner side 121i of the corresponding air inlet opening 121g. Besides, the extension length of each of the flow guiding portions 121f is equal to or slightly less than the length of the inner side 121i of the corresponding air inlet opening 121g, such that the air flow A passing through the above of each of the air inlet openings 121g is blocked or guided by the corresponding flow guiding portion 121f, and enters into the fan housing 121 from each of the air inlet openings 121g, and thus enhances air inlet efficiency. Therefore, the electronic assembly 100 adopted the fan structure 120 has great heat dissipation efficiency.

Moreover, each of the flow guiding portions 121f has a concave surface 121j and a convex surface 121k opposite to each other, wherein each of concave surfaces 121j of the flow guiding portions 121f faces the corresponding the air inlet opening 121g, and each of convex surfaces 121k of the flow guiding portions 121f faces the main portion 121c. The air flow A passing through the above of each of the air inlet openings 121g is blocked or guided by the concave surface 121j of the corresponding flow guiding portion 121f, and enters into the fan housing 121 from each of the air inlet openings 121g, and thus enhances air inlet efficiency.

On the other hand, as illustrated in FIG. 2, the extension lengths of the flow guiding portions 121f are different from each other. Since each of the flow guiding portions 121f extends from one of the connecting portions 121e to another of the connecting portions 121e along the inner side 121i of the corresponding air inlet opening 121g, the extension length of each of the flow guiding portions 121f is determined by the length of the inner side 121i of the corresponding air inlet opening 121g. In this embodiment, the lengths of the inner sides 121i of the air inlet openings 121g are different from each other, and the opening area of the air inlet opening 121g having a longer length of the inner side 121i is greater. That is, the opening areas of the air inlet openings 121g are different from each other, wherein the air inlet opening 121g having greater opening area is disposed the flow guiding portion 121f having longer extension length correspondingly.

In other embodiments, the extension lengths of the flow guiding portions can be partially or completely the same, and the opening areas of the air inlet openings can be partially or completely the same. On the other hand, the air inlet opening having larger opening area can be correspondingly disposed the flow guiding portion having shorter extension length. The configuration of the above can be adjusted according to the actual condition. However, the invention is not limited thereto.

In summary of the foregoing, the fan housing of the fan structure of the invention is configured with the flow guiding portion. The flow guiding portion is adjacent to the air inlet opening and configured to guide the air flows generated during operation of the fan body to enter into the fan housing from the air inlet opening, and thus enhances air inlet efficiency. On the other hand, the flow guiding portion protrudes from the main portion, and keeps a distance with the inner surface of the casing. When the casing is deformed by force, the flow guiding portion has a supportive effect. The effect on the operation of the fan body after deformation of the casing is avoided, and the route for the air passing through is maintained. Therefore, the electronic assembly adopted the fan structure of the invention has great heat dissipation efficiency.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A fan structure, comprising:
   a fan housing, comprising a base and a cover assembled on the base, wherein the cover comprises a main portion, a periphery portion, a plurality of connecting portions and a plurality of flow guiding portions, and the plurality of connecting portions are connected to the main portion and the periphery portion, the cover has a plurality of air inlet openings among the main portion, the periphery portion and the plurality of connecting portions, wherein each of the plurality of flow guiding portions protrudes from the main portion and is adjacent to an inner side of the corresponding air inlet opening, wherein the periphery portion and the plurality of flow guiding portions are separated by the plurality of air inlet openings, wherein each of the plurality of flow guiding portions extends from one of the plurality of connecting portions to another of the plurality of connecting portions along the inner side of the corresponding air inlet opening; and
   a fan body, rotatably disposed in the fan housing.

2. The fan structure according to claim 1, wherein each of the plurality of flow guiding portions has a concave surface and a convex surface opposite to each other, each of the concave surfaces faces toward the corresponding air inlet opening, and each of the convex surfaces faces toward the main portion.

3. The fan structure according to claim 1, wherein each of the plurality of flow guiding portions extends along the inner side of the corresponding air inlet opening, and is located between any two of the plurality of connecting portions.

4. The fan structure according to claim 3, wherein extension lengths of the plurality of flow guiding portions are different from each other.

5. The fan structure according to claim 1, wherein opening areas of the plurality of air inlet openings are different from each other.

6. An electronic assembly, comprising:
   a casing; and
   a fan structure, disposed in the casing, the fan structure comprising:
   a fan housing, comprising a base and a cover assembled on the base, wherein the cover comprises a main portion, a periphery portion, a plurality of connecting portions and a plurality of flow guiding portions, and the plurality of connecting portions are connected to the main portion and the periphery portion, the cover has a plurality of air inlet openings among the main portion, the periphery portion and the plurality of connecting portions, wherein each of the plurality of flow guiding portions protrudes from the main portion, and is adjacent to an inner side of the corresponding air inlet opening, each of the plurality of flow guiding portions keeps a distance with an inner surface of the casing, wherein the periphery portion and the plurality of flow guiding portions are separated by the plurality of air inlet openings, wherein each of the plurality of flow guiding portions extends from one of the plurality of connecting portions to another of the plurality of connecting portions along the inner side of the corresponding air inlet opening; and
   a fan body, rotatably disposed in the fan housing.

7. The electronic assembly according to claim 6, wherein each of the plurality of flow guiding portions has a concave surface and a convex surface opposite to each other, each of the concave surfaces faces toward the corresponding air inlet opening, and each of the convex surfaces faces toward the main portion.

8. The electronic assembly according to claim 6, wherein each of the plurality of flow guiding portions extends along the inner side of the corresponding air inlet opening, and is located between any two of the plurality of connecting portions.

9. The electronic assembly according to claim 8, wherein extension lengths of the plurality of flow guiding portions are different from each other.

10. The electronic assembly according to claim 6, wherein opening areas of the plurality of air inlet openings are different from each other.

* * * * *